(12) United States Patent
Reddy (10) Patent No.: US 7,515,475 B1
(45) Date of Patent: Apr. 7, 2009

(54) MECHANISM FOR COMPENSATING FOR GATE LEAKAGE IN A MEMORY

(75) Inventor: Sagar V. Reddy, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 132 days.

(21) Appl. No.: 11/824,883

(22) Filed: Jul. 2, 2007

(51) Int. Cl.
*G11C 11/03* (2006.01)

(52) U.S. Cl. .................. 365/185.23; 365/189.11; 365/210.12; 365/230.06

(58) Field of Classification Search ............ 365/185.23, 365/189.11, 210.12, 230.06
See application file for complete search history.

(56) References Cited

U.S. PATENT DOCUMENTS

2007/0041263 A1*  2/2007  Rolandi ............... 365/230.06
2008/0198683 A1*  8/2008  Oosaka ................ 365/230.06

* cited by examiner

*Primary Examiner*—Pho M. Luu
(74) *Attorney, Agent, or Firm*—Bobby K. Truong; Hickman Palermo Truong & Becker LLP (57) ABSTRACT

A memory is disclosed having one or more logic level reinforcement circuits (LLRC's) coupled to each wordline. Each LLRC has an input and an output, both of which are coupled to a corresponding wordline. The LLRC senses a present logic level on the wordline. If the present logic level is a first logic level, then the LLRC outputs a first logic level reinforcement signal onto the wordline to push the voltage on the wordline towards a desired voltage for that logic level. If the present logic level is the second logic level, then the LLRC outputs a second logic level reinforcement signal onto the wordline to push the voltage on the wordline towards a desired voltage for that logic level. By doing so, the LLRC compensates for the undesirable effects of gate leakage, and enables the memory to operate effectively and efficiently despite the gate leakage.

17 Claims, 6 Drawing Sheets

MECHANISM FOR COMPENSATING FOR GATE LEAKAGE IN A MEMORY

BACKGROUND

In the semiconductor industry, there is a constant push to make devices (e.g. transistors) smaller and smaller. By making devices smaller, it is possible to fit more circuitry onto the same semiconductor real estate, which in turn makes it possible to manufacture denser and less expensive components. While smaller devices give rise to many advantages, they may also cause some problems. One of the potential problems is gate leakage. In larger MOS transistors, it is safe to assume that the oxide layer between the gate terminal and the substrate is sufficiently large that there is almost no tunneling current between the gate and source and the gate and drain. However, as transistors get smaller and smaller, this oxide layer diminishes, and at some point, the oxide layer will become so small that the tunneling current will no longer be negligible. This tunneling current, also referred to herein as gate leakage, can lead to operational problems.

Figure 1A:
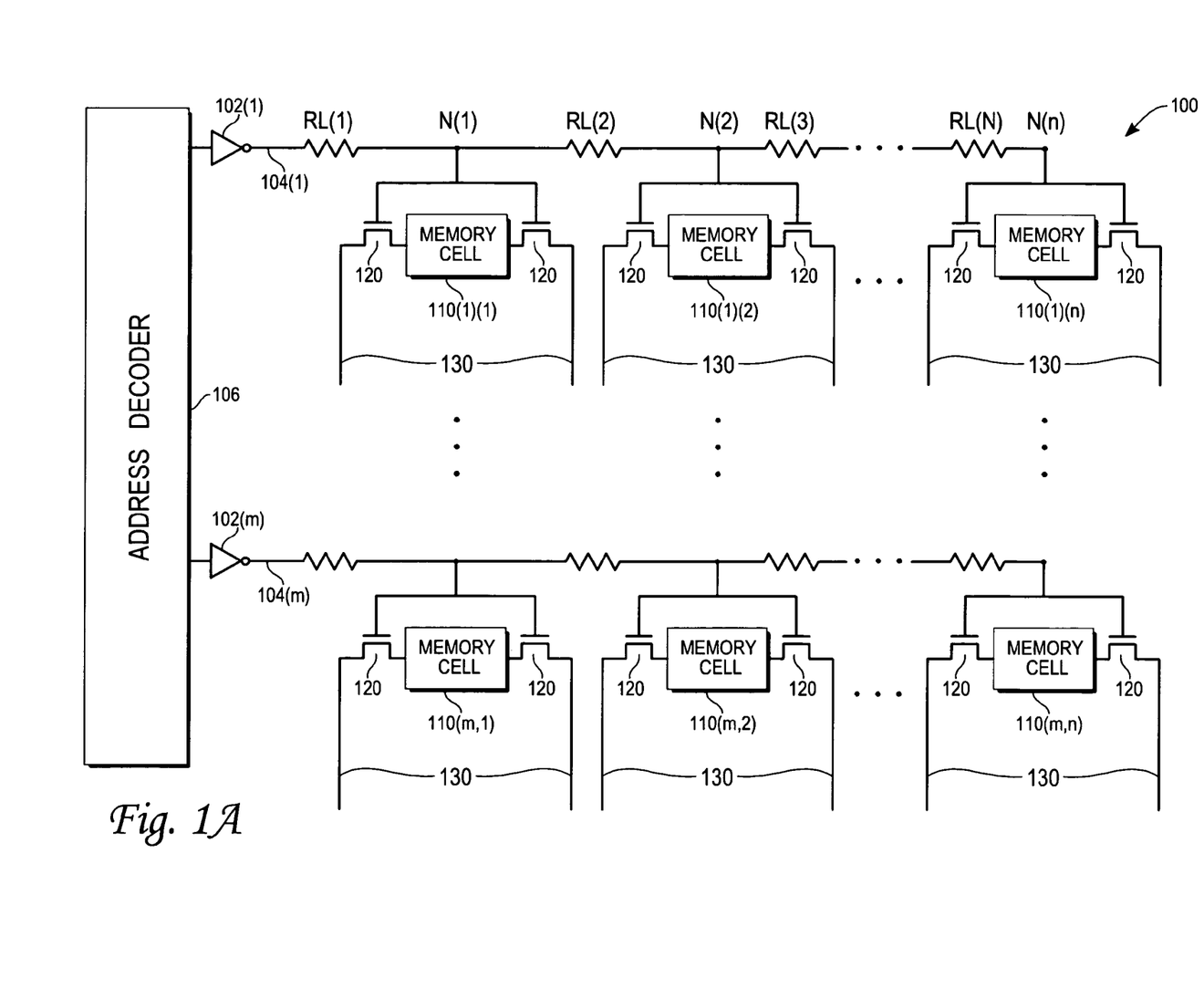
FIGS. 1A-1B show a sample memory portion to illustrate the effects of gate leakage.

To illustrate how gate leakage can adversely affect a memory, reference will be made to the sample memory 100 shown in FIG. 1A, in which memory cells 110 are arranged in rows and columns. As shown in FIG. 1A, each row of memory cells 110 is coupled to a corresponding wordline 104, and each column of memory cells 110 is coupled to a pair of complementary bit lines 130. The wordlines 104 enable the memory cells 110 to be accessed (for read or for write) one row at a time, and the bit lines 130 enable data to be read out of or written into the memory cells 110.

Each wordline 104 is driven by a wordline driver 102, which in turn is controlled by an address decoder 106. A wordline driver 102 may drive a wordline 104 to a first logic level (e.g. a logic 1) to enable the memory cells 110 coupled to that wordline 104 to be accessed, or it may drive the wordline 104 to a second logic level (e.g. a logic 0) to prevent the memory cells 110 coupled to that wordline 104 from being accessed. As shown in FIG. 1A, each memory cell 110 is coupled to a wordline 104 via a pair of pass transistors 120. It is these pass transistors 120 that are turned on and off by a wordline driver 102 to enable or disable access to the memory cells 110. When a wordline driver 102 drives a wordline 104 to the first logic level, the pass transistors 120 coupled to that wordline 104 are turned on, which enables data to be read from or written into that row of memory cells 110 (via the bit lines 130). Conversely, when a wordline driver 102 drives a wordline 104 to the second logic level, the pass transistors 120 coupled to that wordline are turned off, which prevents the memory cells 110 in that row from being accessed. When the wordline 104 is driven to the first logic level, the pass transistors 120 are said to be in "normal operational mode" (i.e. access mode). When the wordline 104 is driven to the second logic level, the pass transistors 120 are said to be in "standby mode" (i.e. non-access mode).

Ideally, once a wordline 104 has made a transition from one logic level to another, there should be no current flowing between the wordline 104 and the pass transistors 120. Put another way, the pass transistors 120 should act as open circuits. However, because of tunneling current (i.e. gate leakage), these pass transistors 120 do not behave as open circuits; rather, they draw current from, or drive current onto the wordline 104. This can lead to undesirable results.

Figure 1B:
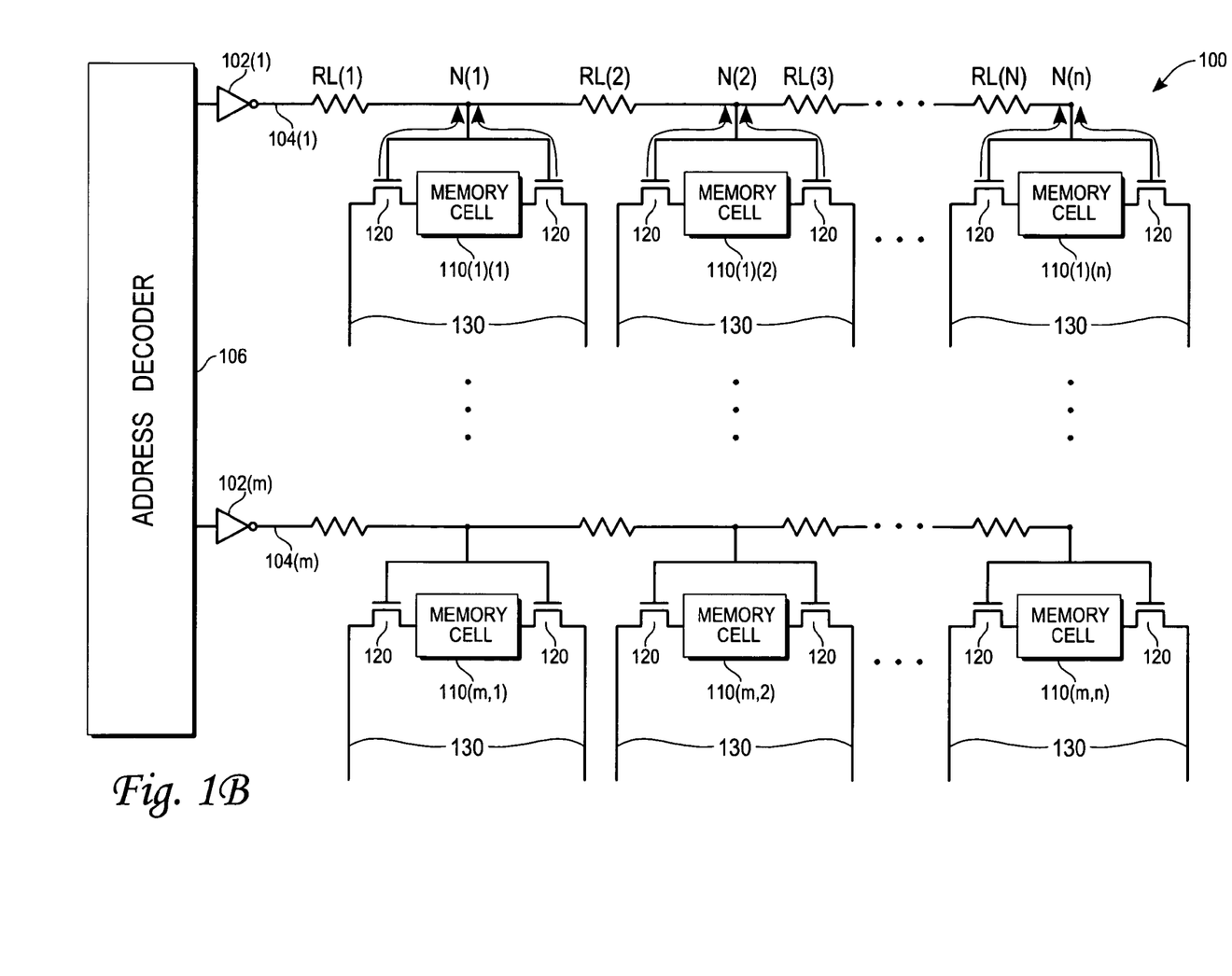

To illustrate, suppose that wordline driver 102(1) has driven wordline 104(1) to logic 0 (at logic 0, the voltage on wordline 104(1) should ideally be at 0 volts). At this logic level, the pass transistors 120 coupled to wordline 104(1) should be turned off (i.e. should be in standby mode). Once wordline driver 102(1) has driven wordline 104(1) to logic 0, there should ideally be no current flowing between wordline 104(1) and the pass transistors 120 coupled to wordline 104 (1). However, because of tunneling current from the source to the gate and from the drain to the gate of the pass transistors 120, there is some current flow. This current flow is shown in FIG. 1B, where current is depicted as flowing from the gate of each pass transistor 120 onto wordline 104(1). This current will encounter the line resistances RL of wordline 104(1) (for the sake of simplicity, it will be assumed that each segment of wordline 104(1) has the same line resistance of RL). Because of this current flow through the line resistance RL(1), the voltage at node N(1) will be slightly higher than the voltage (which will be presumed to be 0 volts) put out by wordline driver 104(1). Similarly, due to the current flow through the line resistance RL(2), the voltage at node N(2) will be slightly higher than the voltage at node N(1). Continuing this analysis through to node N(n), it will be clear that the voltage at node N(n) will be higher than the voltage at node N(n−1), which will be higher than the voltage at the preceding nodes. Thus, because of the tunneling current, the voltages at the various nodes will be higher than the ideal 0 volts, with the node N(n) (referred to as the outermost edge node) experiencing the highest voltage.

These elevated voltages cause the pass transistors 120 (especially those coupled to the outer edge nodes) to be partially turned on, which in turn causes the charge on the memory cells 110 to leak onto the bit lines 130. This leakage causes unnecessary power consumption. For a high capacity memory have a large number of memory cells, this additional power consumption can be significant. Since minimizing power consumption is a goal of most memories, this unnecessary power consumption during standby mode is a highly undesirable result.

Figure 1C:
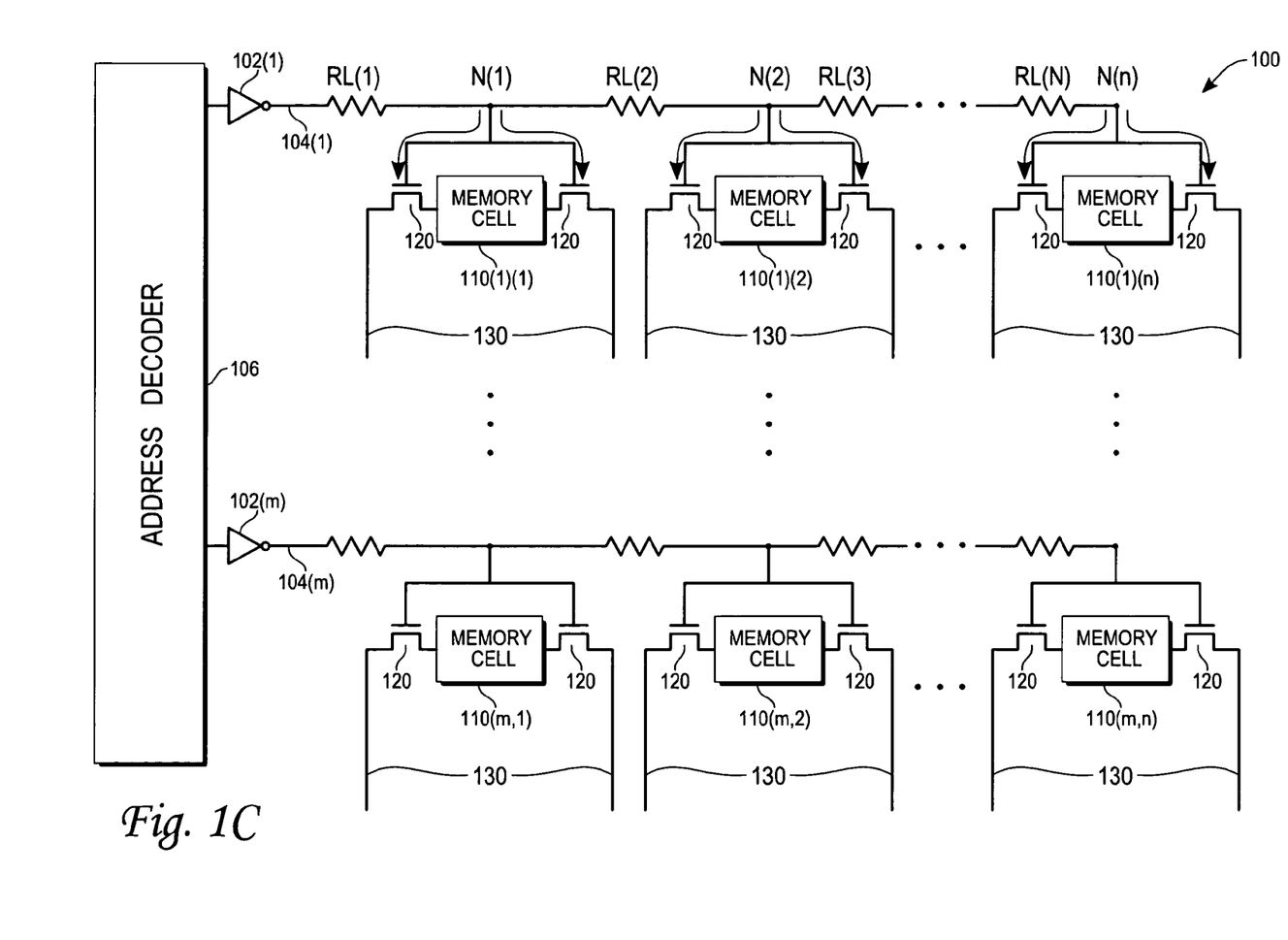

Gate leakage also adversely affects a memory in normal operational mode. To illustrate, suppose that wordline driver 102(1) has driven wordline 104(1) to logic 1 (at logic 1, the voltage on wordline 104(1) should ideally be at a reference voltage Vdd). At this logic level, the pass transistors 120 coupled to wordline 104(1) should be turned on (i.e. should be in normal operational mode). Once wordline driver 102(1) has driven wordline 104(1) to logic 1, there should ideally be no current flowing between wordline 104(1) and the pass transistors 120 coupled to wordline 104(1). However, because of tunneling current from the gate to the substrate and from the gate to the source and drain of the pass transistors 120, there is some current flow. This current flow is shown in FIG. 1C, where current is depicted as flowing from wordline 104(1) to the gate of each pass transistor 120. This current will encounter the line resistances RL of wordline 104(1). Because of this current flow through the line resistance RL(1), the voltage at node N(1) will be slightly lower than the voltage (which will be presumed to be Vdd) put out by wordline driver 104(1). Similarly, due to the current flow through the line resistance RL(2), the voltage at node N(2) will be slightly lower than the voltage at node N(1). Continuing this analysis through to node N(n), it will be clear that the voltage at node N(n) will be lower than the voltage at node N(n−1), which will be lower than the voltage at the preceding nodes. Thus, because of the tunneling current, the voltages at the various nodes will be lower than the ideal Vdd, with the node N(n) experiencing the lowest voltage.

These lower voltages cause the pass transistors 120 (especially those coupled to the outer edge nodes) to not be fully turned on, which in turn reduces the drive of the pass transistors 120. This reduces the speed at which the memory cells 110 can be read or written, which in turn degrades the performance of the memory. If the speed is reduced too much, the memory may not even be usable ("weak bit" effect), which would reduce the memory yield (i.e. a higher percentage of the memory may have to be discarded as not meeting required specifications). In addition, the memory may suffer from the transient effect of bitline to wordline coupling. The memory cells 110 coupled to the outer edge nodes will be worst hit because the path to recovery is through the wordline driver 102(1) at the other end of the wordline 104(1). Furthermore, writability may be a problem for the memory cells 110 coupled to the outer edge nodes as the pass transistors 110 are less turned on.

Overall, the gate leakage problem is a potentially significant one that can lead to adverse consequences. As a result, a mechanism is needed to mitigate its effects.

SUMMARY

In accordance with one embodiment of the present invention, there is provided an improved memory architecture that enables the effects of gate leakage to be mitigated. In this architecture, one or more logic level reinforcement circuits (LLRC's) are coupled to each wordline. Each LLRC has an input coupled to the wordline and an output also coupled to the wordline. The LLRC senses a present logic level on the wordline. This present logic level may be a first logic level (e.g. a logic 1) or a second logic level (e.g. a logic 0). If the present logic level is the first logic level, then the LLRC outputs a first logic level reinforcement signal onto the wordline to push the voltage on the wordline towards a desired voltage for that logic level. For example, if the first logic level is a logic 1, and if the desired voltage for that logic level is a reference voltage Vdd, then the LLRC will output a logic level reinforcement signal onto the wordline that will push the voltage on the wordline towards Vdd.

Similarly, if the present logic level is the second logic level, then the LLRC outputs a second logic level reinforcement signal onto the wordline to push the voltage on the wordline towards a desired voltage for that logic level. For example, if the second logic level is a logic 0, and if the desired voltage for that logic level is 0 volts, then the LLRC will output a logic level reinforcement signal onto the wordline that will push the voltage on the wordline towards 0 volts.

In effect, the LLRC pushes the voltage on the wordline towards the ideal voltage for the present logic level. By doing so, the LLRC compensates for the undesirable effects of gate leakage, and enables the memory to operate effectively and efficiently in spite of it.

DETAILED DESCRIPTION OF EMBODIMENT(S)

Memory Overview

Figure 2:
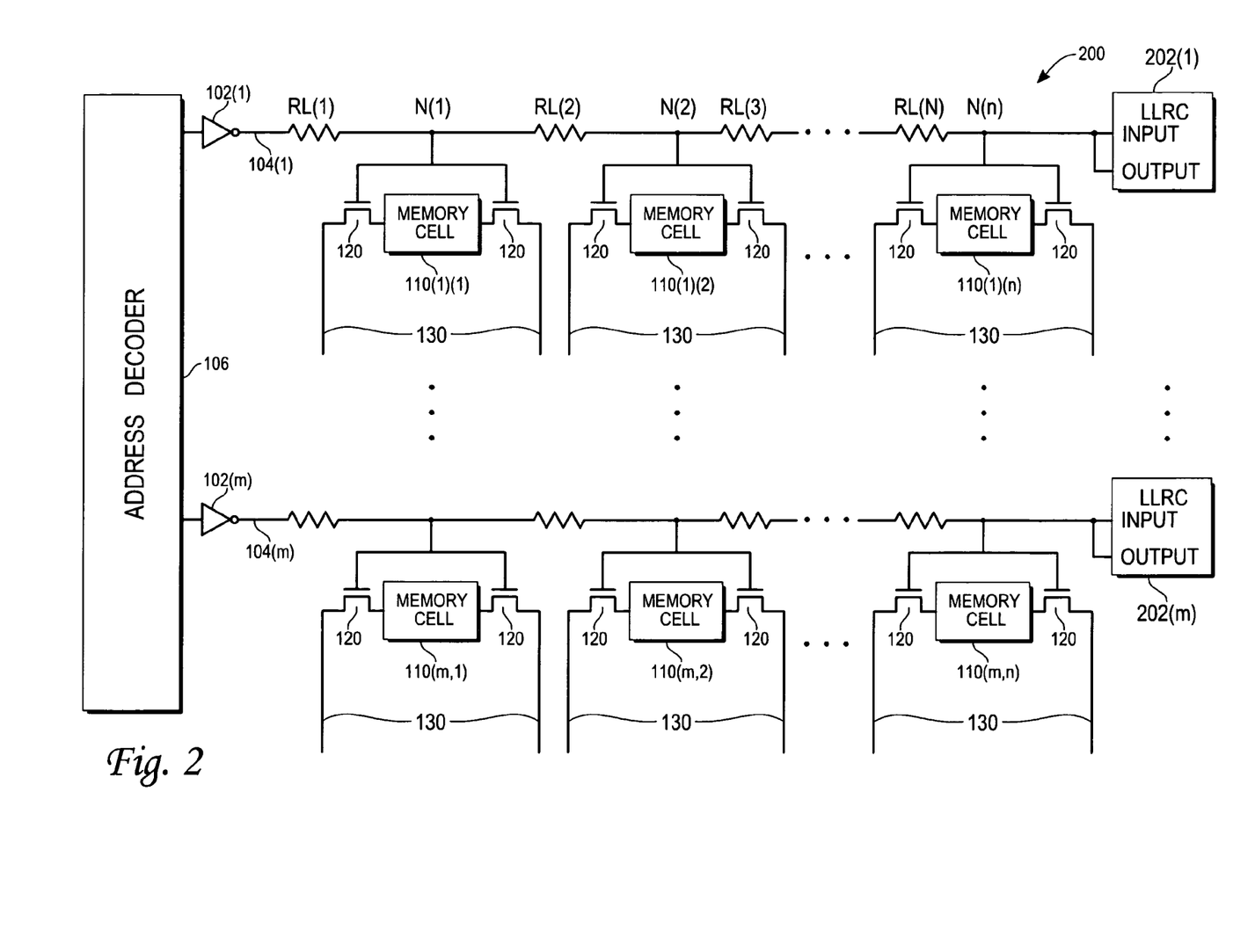
FIG. 2 is a block diagram of a portion of a memory in accordance with one embodiment of the present invention.

FIG. 2 shows a block diagram of a portion of a memory 200 in accordance with one embodiment of the present invention. The memory 200 of FIG. 2 is similar to the memory 100 of FIGS. 1A-1C except that a logic level reinforcement circuit (LLRC) 202 has been added to each wordline 104. In the embodiment shown in FIG. 2, a wordline driver 102 is coupled to one end portion of each wordline 104 and an LLRC 202 is coupled to the opposite end portion of each wordline 104.

In one embodiment, each LLRC 202 has an input and an output, both of which are coupled to a corresponding wordline 104. The input of an LLRC 202 senses a present logic level on the wordline 104. This present logic level may be a first logic level (e.g. a logic 1) or a second logic level (e.g. a logic 0). Each logic level has a corresponding range of voltages. For example, logic 1 may have a voltage range ranging from a desired reference voltage Vdd to some lower level threshold voltage. Logic 0 may have a voltage range ranging from a desired 0 volts to some higher level threshold voltage. Any voltage within the logic 1 voltage range will be recognized by the input of the LLRC 202 as a logic 1, and any voltage within the logic 0 voltage range will be recognized by the input of the LLRC 202 as a logic 0.

In response to the logic level sensed by the input, the output of the LLRC 202 outputs a logic level reinforcement signal onto the wordline 104 to push the voltage on the wordline 104 towards the desired voltage for that logic level. For example, if the present logic level on the wordline 104 is a logic 1, then the output of the LLRC 202 will output a logic level reinforcement signal onto the wordline 104 to push the voltage on the wordline 104 towards Vdd. Conversely, if the present logic level on the wordline 104 is a logic 0, then the output of the LLRC 202 will output a logic level reinforcement signal onto the wordline 104 to push the voltage on the wordline 104 towards 0 volts. By doing so, the LLRC 202 reinforces the logic level imposed by a wordline driver 102, and helps the wordline driver 102 to drive the pass transistors 120 coupled to a wordline 104 to a more fully on state or a more fully off state. By helping the wordline driver 102 to turn the pass transistors 120 more fully on or more fully off, the LLRC 202 mitigates the undesirable effects caused by gate leakage.

Sample Operation

Figure 3A:
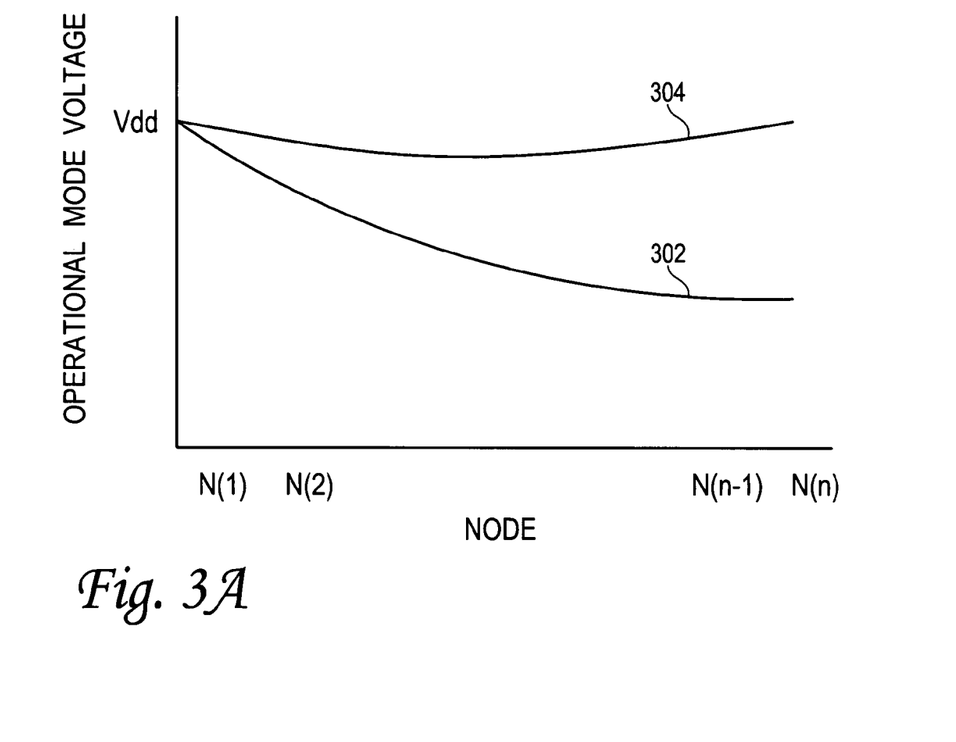
FIGS. 3A and 3B show the voltages experienced by the various nodes on a wordline.

To illustrate this more clearly, reference will be made to some operational examples. Suppose that the address decoder 106 decodes an address and determines that the row of memory cells coupled to wordline 104(1) should be read. In response to this determination, the address decoder 106 sends an appropriate signal to wordline driver 102(1), which in turn drives a logic 1 onto wordline 104(1) to turn the pass transistors 120 on (thereby enabling access to the memory cells). Assuming that wordline driver 102(1) is able to achieve an ideal logic 1 voltage, the voltage at the output of wordline driver 102(1) will be a reference voltage Vdd. However, as discussed previously, because of tunneling current, this ideal voltage will not appear at the various nodes N(1)-N(n) on wordline 104(1). Rather, the various nodes will experience lower voltages. The voltages experienced by the various nodes is shown by curve 302 in FIG. 3A. As can be seen, the voltages decrease as the nodes get farther away from wordline driver 102(1), with node N(n) experiencing the lowest voltage. Curve 302 represents what the voltages would be if LLRC 202(1) were not present.

Despite the fact that the voltage at node N(n) is lower than Vdd, it is still within the voltage range corresponding to a logic 1. Thus, the input of LLRC 202(1) will still sense a logic 1 on wordline 104(1). In response to sensing a logic 1, LLRC 202(1) will output a logic level reinforcement signal onto wordline 104(1) to push the voltage on wordline 104(1) towards Vdd. In effect, LLRC 202(1) is driving a logic 1 back to wordline driver 102(1). Doing so helps to reinforce the logic 1 on wordline 104(1), which in turn, helps to turn the pass transistors 120 on more fully. The resulting voltage experienced by the various nodes is shown by curve 304 in FIG. 3A. Notice from curve 304 that the nodes farthest from the wordline driver 102(1) are no longer experiencing the lowest voltages. Rather, because they are closer to the LLRC 202(1), they are now experiencing a voltage very close to Vdd. With the presence of LLRC 202(1), the nodes that now experience the lowest voltages are the nodes in the middle of the wordline 104(1). Notice, however, that even these nodes do not experience a voltage that is that much lower than Vdd. Thus, as curve 304 shows, the presence of LLRC 202(1) boosts the voltages on almost all of the nodes on wordline 104(1), which in turn causes the pass transistors 120 coupled to the nodes to be more fully turned on. Because the pass transistors 120 are more fully turned on, the problems discussed above in connection with normal operational mode are mitigated and perhaps even eliminated.

Figure 3B:
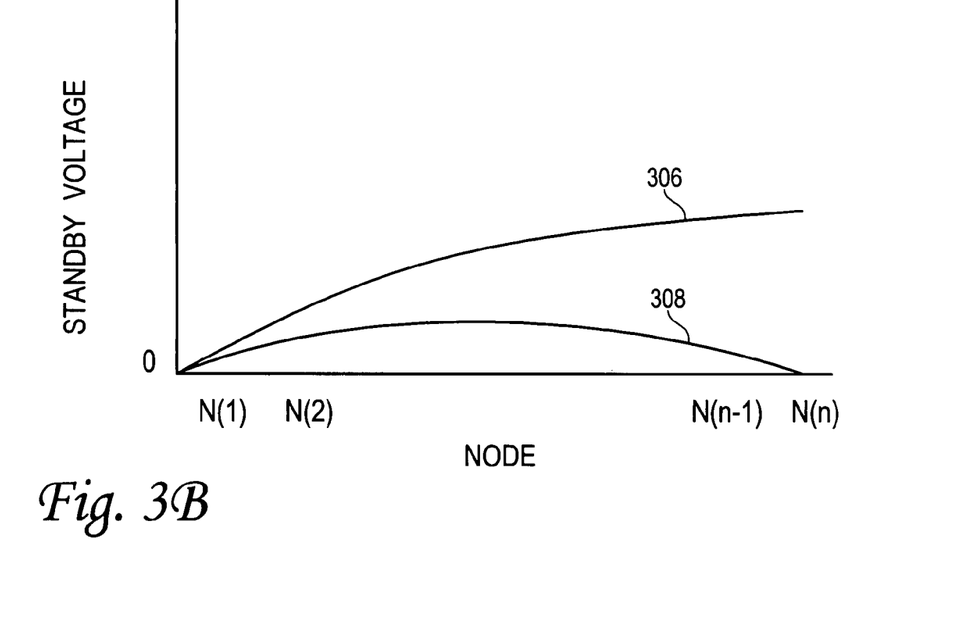

Suppose that the memory cells coupled to wordline 104(1) have been read and that the address decoder 106 now decides to disable access to that row of memory cells. In response to this decision, the address decoder 106 sends an appropriate signal to wordline driver 102(1), which in turn drives a logic 0 onto wordline 104(1) to turn the pass transistors 120 off (thereby disabling access to the memory cells). Assuming that wordline driver 102(1) is able to achieve an ideal logic 0 voltage, the voltage at the output of wordline driver 102(1) will be 0 volts. However, as discussed previously, because of tunneling current, this ideal voltage will not appear at the various nodes N(1)-N(n) on wordline 104(1). Rather, the various nodes will experience higher voltages. The voltages experienced by the various nodes is shown by curve 306 in FIG. 3B. As can be seen, the voltages increase as the nodes get farther away from wordline driver 102(1), with node N(n) experiencing the highest voltage. Curve 306 represents what the voltages would be if LLRC 202(1) were not present.

Despite the fact that the voltage at node N(n) is higher than 0 volts, it is still within the voltage range corresponding to a logic 0. Thus, the input of LLRC 202(1) will still sense a logic 0 on wordline 104(1). In response to sensing a logic 0, LLRC 202(1) will output a logic level reinforcement signal onto wordline 104(1) to push the voltage on wordline 104(1) towards 0 volts. In effect, LLRC 202(1) is driving a logic 0 back to wordline driver 102(1). Doing so helps to reinforce the logic 0 on wordline 104(1), which in turn, helps to turn the pass transistors 120 off more fully. The resulting voltage experienced by the various nodes is shown by curve 308 in FIG. 3B. Notice from curve 308 that the nodes farthest from the wordline driver 102(1) are no longer experiencing the highest voltages. Rather, because they are closer to the LLRC 202(1), they are now experiencing a voltage very close to 0 volts. With the presence of LLRC 202(1), the nodes that now experience the highest voltages are the nodes in the middle of the wordline 104(1). Notice, however, that even these nodes do not experience a voltage that is that much higher than 0 volts. Thus, as curve 308 shows, the presence of LLRC 202(1) lowers the voltages on almost all of the nodes on wordline 104(1), which in turn causes the pass transistors 120 coupled to the nodes to be more fully turned off. Because the pass transistors 120 are more fully turned off, the problems discussed above in connection with standby mode are mitigated and perhaps even eliminated.

In the manner described above, the LLRC 202 reinforces the logic level sensed on a wordline 104. By doing so, the LLRC 202 helps to mitigate the undesirable effects of gate leakage.

Sample LLRC

For purposes of the present invention, an LLRC 202 may take on any desired form. So long as it performs the functions described above, any circuit or component may be used as an LLRC 202. For the sake of example, in one embodiment, an LLRC 202 takes the form of a latch 400, such as that shown in FIG. 4. Latch 400 comprises two inverters 402, 404 coupled in a loop. Specifically, the output of inverter 402 is coupled to the input of inverter/driver 404, and the output of inverter/driver 404 is coupled to the input of inverter 402. The input of inverter 402 functions as the input to the latch 400 and the output of inverter/driver 404 functions as the output of the latch 400. As shown, both the input and the output of the latch 400 are coupled to a corresponding wordline 104. Coupled in this way, the inverters 402, 404 will sense a logic level on the wordline 104, and latch on and hold that logic value. Since the output of the latch 400 is coupled back to the wordline 104, the latch 400 will drive the sensed logic level back onto the wordline 104, thereby reinforcing the sensed logic level. The greater the capacity of the inverter/driver 404, the greater the ability of the latch 400 will be to reinforce the sensed logic level.

Figure 4:
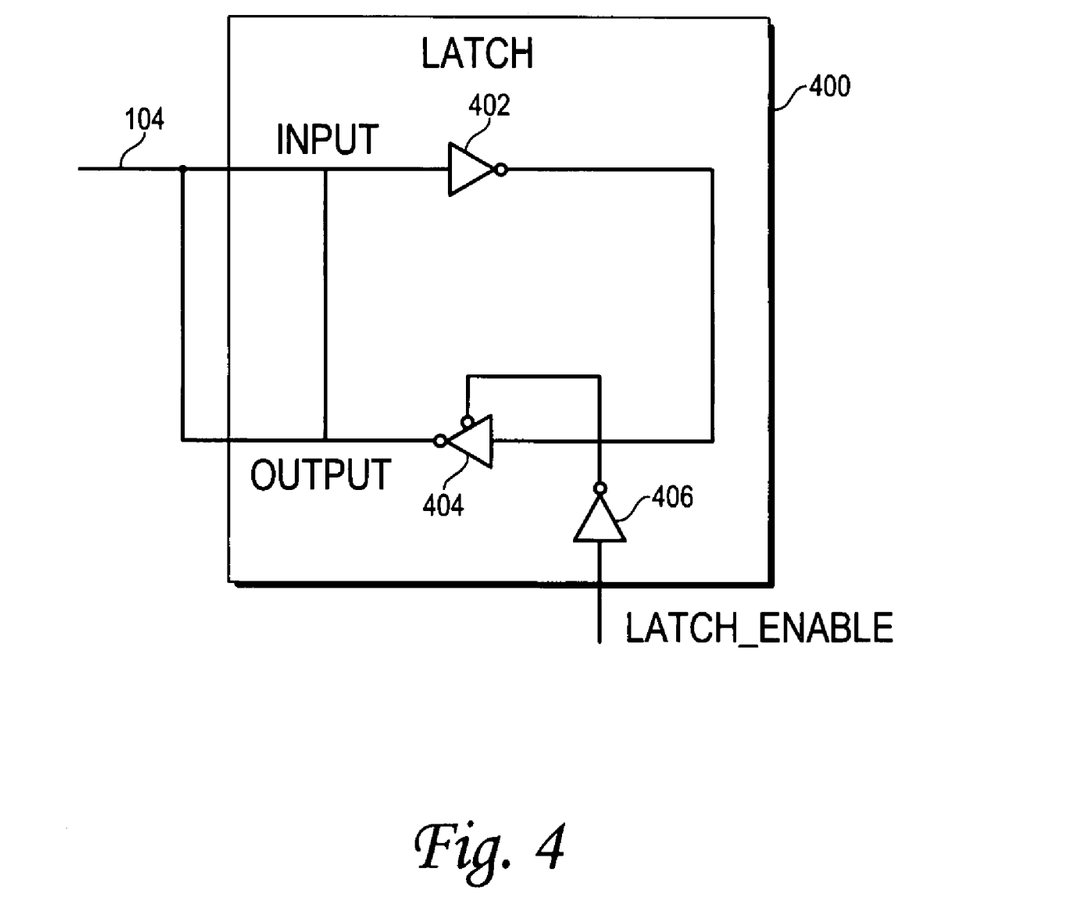
FIG. 4 shows a sample latch that may be used to implement a logic level reinforcement circuit, in accordance with one embodiment of the present invention.

In one embodiment, the inverter/driver 404 is a tri-statable driver that can be activated and deactivated. The inverter/driver 404 may be activated or deactivated by another inverter 406 in response to a Latch_Enable signal. When the Latch_Enable signal is asserted, the inverter/driver 404 is tri-stated (i.e. deactivated). In one embodiment, the Latch_Enable signal is a pulsed signal that is asserted whenever a Write_Enable or a Read_Enable signal is asserted. Set up in this way, the output of the latch 400 will be disabled when the wordline 104 is switching states. This ensures that the latch 400 will not try to drive any logic level onto the wordline 104 when the wordline is changing from a logic 0 to a logic 1 or vice versa.

The latch 400 shown in FIG. 4 is just one of many possible implementations for LLRC 202. Many other components may be used to implement LLRC 202, including but not limited to flip-flops, registers, Schmidt triggers, etc. All such implementations are within the scope of the present invention.

Alternative Embodiments

In the embodiment shown in FIG. 2, the wordline driver 102 is shown as being coupled to one end portion of a wordline 104 while the LLRC 202 is shown as being coupled to an opposite end portion of the wordline 104. While this is one possible arrangement, it is not the only one. If so desired, the LLRC 202 may be coupled to an intermediate portion of a wordline 104 (e.g. at node N(n−1)) instead of to an end portion. Likewise, the wordline driver 102 may be coupled to an intermediate portion of a wordline 104 (e.g. at node N(2)) instead of an end portion. Furthermore, if the wordline driver 102 is coupled to an intermediate portion of a wordline 104, there may be multiple LLRC's 202 coupled to the wordline 104 (e.g. one LLRC 202 on each of the two end portions of the wordline 104). Overall, for purposes of the present invention, any number of wordline drivers 102 may be coupled to any portions of a wordline 104, and any number of LLRC's 202 may be coupled to any portions of the wordline 104. All such arrangements are within the scope of the present invention.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims and the equivalents thereof.

What is claimed is:

1. A memory, comprising:
    a plurality of memory cells;
    a wordline coupled to each of the plurality of memory cells;
    a wordline driver having an output coupled to the wordline, the wordline driver capable of driving the wordline to a first logic level to enable access to the plurality of memory cells, and capable of driving the wordline to a second logic level to disable access to the plurality of memory cells, wherein the first logic level corresponds to a first range of voltages including a first desired voltage which is a desired voltage for the first logic level, and the second logic level corresponds to a second range of voltages including a second desired voltage which is a desired voltage for the second logic level; and
    a logic level reinforcement circuit (LLRC) having an input coupled to the wordline and an output also coupled to the wordline, the LLRC sensing a present logic level on the wordline, which may be either the first logic level or the second logic level, and if the present logic level is the first logic level, the LLRC outputting a first logic level reinforcement signal onto the wordline to push a voltage on the wordline towards the first desired voltage, and if the present logic level is the second logic level, the LLRC outputting a second logic level reinforcement signal onto the wordline to push the voltage on the wordline towards the second desired voltage.

2. The memory of claim 1, wherein the output of the wordline driver is coupled to a first portion of the wordline, and wherein the input and output of the LLRC are coupled to a second portion of the wordline, wherein the second portion is spatially separated from the first portion.

3. The memory of claim 2, wherein the first portion of the wordline is a first end portion of the wordline, and wherein the second portion of the wordline is an opposite end portion of the wordline.

4. The memory of claim 2, wherein the first portion of the wordline is a first intermediate portion of the wordline, and wherein the second portion of the wordline is a second and different intermediate portion of the wordline.

5. The memory of claim 2, wherein the first portion of the wordline is an intermediate portion of the wordline, and wherein the second portion of the wordline is a first end portion of the wordline.

6. The memory of claim 5, wherein the memory further comprises a second LLRC having an input and an output, wherein the input and output of the second LLRC are coupled to a third portion of the wordline, and wherein the third portion of the wordline is a second end portion of the wordline which is opposite the first end portion.

7. The memory of claim 1, wherein each of the plurality of memory cells is coupled to the wordline via one or more pass transistors, and wherein the one or more pass transistors experience current leakage through their gate terminals.

8. The memory of claim 1, wherein the LLRC comprises a latch.

9. The memory of claim 1, wherein the LLRC comprises a flip flop.

10. The memory of claim 1, wherein the LLRC comprises a register.

11. The memory of claim 1, wherein the LLRC comprises a Schmidt trigger.

12. The memory of claim 1, wherein the output of the LLRC is rendered inactive when the wordline driver is transitioning from driving the first logic level onto the wordline to driving the second logic level onto the wordline, and vice versa.

13. The memory of claim 12, wherein the output of the LLRC comprises an output driver that can be tri-stated, and wherein the output driver is tri-stated when the wordline driver is transitioning from driving the first logic level onto the wordline to driving the second logic level onto the wordline, and vice versa.

14. The memory of claim 13, wherein the output driver is tri-stated in response to a control signal, and wherein the control signal is asserted when either a read enable or a write enable signal is asserted.

15. In a memory comprising a wordline and a plurality of memory cells, wherein each of the plurality of memory cells is coupled to the wordline, a method comprising:
    driving the wordline to either a first logic level to enable access to the plurality of memory cells, or a second logic level to disable access to the plurality of memory cells, wherein the first logic level corresponds to a first range of voltages including a first desired voltage which is a desired voltage for the first logic level, and the second logic level corresponds to a second range of voltages including a second desired voltage which is a desired voltage for the second logic level;
    sensing a present logic level on the wordline;
    in response to sensing that the present logic level is the first logic level, outputting a first logic level reinforcement signal onto the wordline to push a voltage on the wordline towards the first desired voltage; and
    in response to sensing that the present logic level is the second logic level, outputting a second logic level reinforcement signal onto the wordline to push the voltage on the wordline towards the second desired voltage.

16. The method of claim 15, further comprising:
    determining whether the present logic level on the wordline is about to transition from one logic level to another logic level; and
    in response to determining that the present logic level on the wordline is about to transition from one logic level to another logic level, preventing any logic level reinforcement signal from being outputted onto the wordline.

17. The method of claim 16, wherein determining whether the present logic level on the wordline is about to transition from one logic level to another logic level comprises:
    determining whether a read enable signal or a write enable signal has been asserted.

* * * * *